US008675434B1

(12) United States Patent
Whately et al.

(10) Patent No.: US 8,675,434 B1
(45) Date of Patent: Mar. 18, 2014

(54) HIGH SPEED TIME INTERLEAVED SENSE AMPLIFIER CIRCUITS, METHODS AND MEMORY DEVICES INCORPORATING THE SAME

(75) Inventors: Morgan Whately, San Francisco, CA (US); Thinh Tran, Palo Alto, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 2 days.

(21) Appl. No.: 13/459,206

(22) Filed: Apr. 29, 2012

Related U.S. Application Data

(60) Provisional application No. 61/602,270, filed on Feb. 23, 2012.

(51) Int. Cl.
*G11C 7/00* (2006.01)
(52) U.S. Cl.
USPC ............... 365/205; 365/189.02; 365/230.03; 365/233.1
(58) Field of Classification Search
USPC .............. 365/189.02, 205, 230.03, 233.1
See application file for complete search history.

(56) References Cited

U.S. PATENT DOCUMENTS

| 5,559,752 | A | * | 9/1996 | Stephens et al. ........... 365/233.1 |
| 5,559,986 | A | | 9/1996 | Alpert et al. |
| 5,659,513 | A | | 8/1997 | Hirose et al. |
| 5,848,428 | A | | 12/1998 | Collins |
| 5,991,217 | A | | 11/1999 | Tavrow et al. |
| 5,991,223 | A | * | 11/1999 | Kozaru et al. ............ 365/230.03 |
| 6,396,764 | B1 | | 5/2002 | Holland |
| 6,529,402 | B1 | | 3/2003 | Andersen et al. |
| 6,826,069 | B2 | | 11/2004 | Kurjanowicz et al. |
| 6,941,414 | B2 | | 9/2005 | Hsu et al. |
| 6,961,276 | B2 | | 11/2005 | Atallah et al. |
| 7,679,979 | B1 | | 3/2010 | Kim |
| 2005/0063211 | A1 | * | 3/2005 | Atallah et al. ............... 365/145 |
| 2008/0094928 | A1 | * | 4/2008 | Yokoyama .................. 365/205 |
| 2008/0151665 | A1 | * | 6/2008 | Kim et al. .................... 365/205 |
| 2012/0176856 | A1 | * | 7/2012 | Hsu et al. ................ 365/230.03 |
| 2012/0307545 | A1 | * | 12/2012 | McAdams et al. ........... 365/145 |

OTHER PUBLICATIONS

Jei-Hwan Yoo, et al._A 32-Bank 1 Gb Self-Strobing Synchronous DRAM with 1 GByte/s Bandwidth_Dated Nov. 1996_10 pages.
Leland Chang, et al._An 8t-SRAM for Variability Tolerance and Low-Voltage Operation in High-Performance Caches_Dated Apr. 2008_8 pages.
Naveen Verma_Ultra-low-power SRAM Design in High Variability Advanced CMOS_Dated 2009_3 pages.
Search Report for U.S. Appl. No. 13/459,206, Dated Apr. 2012, 14 pages.
Srikanth Sundaram, et al._High Speed Robust Current Sense Amplifier for Nanoscale Memories:-A Winner Take All Approach_Dated 2006_6 pages.

* cited by examiner

*Primary Examiner* — Hoai V Ho

(57) ABSTRACT

A memory device can include first sense amplifiers coupled to bit lines of a memory array in a first access period and decoupled from the bit lines in a first sense period, the first sense amplifiers configured to amplify data signals from the memory array in the first sense period; and second sense amplifiers coupled to the bit lines in a second access period that follows the first access period and configured to amplify data signals from the memory cell array in a second sense period that overlaps the first sense period.

20 Claims, 7 Drawing Sheets

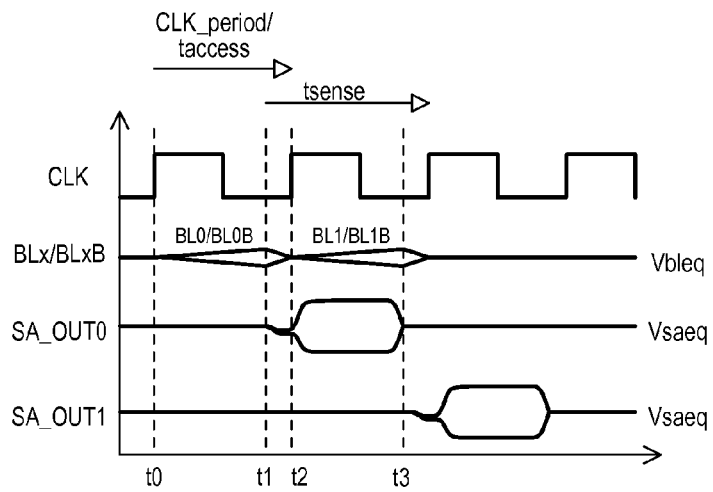
FIG. 3
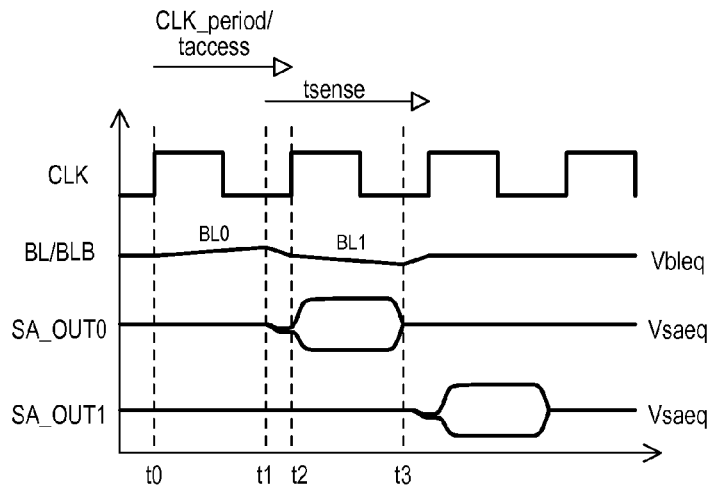
FIG. 4
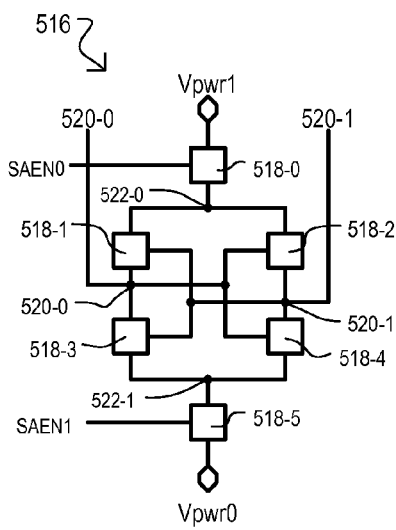
FIG. 5
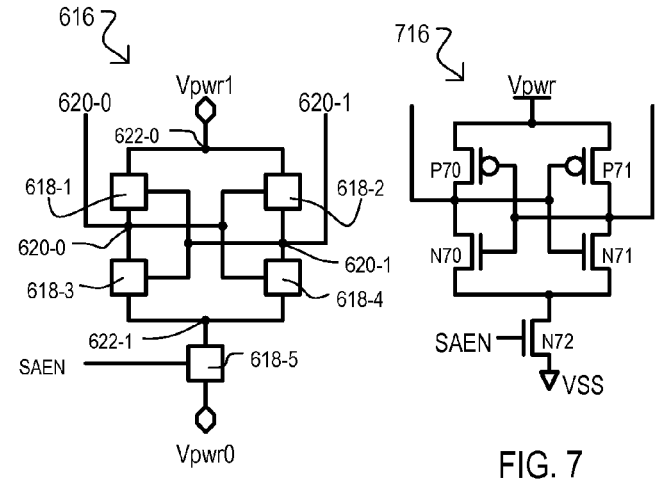
FIG. 6
FIG. 7

(BACKGROUND)

(BACKGROUND)

HIGH SPEED TIME INTERLEAVED SENSE AMPLIFIER CIRCUITS, METHODS AND MEMORY DEVICES INCORPORATING THE SAME

This application claims the benefit of U.S. provisional patent application Ser. No. 61/602,270 filed on Feb. 23, 2012, the contents of which are incorporated by reference herein.

TECHNICAL FIELD

The present disclosure relates generally to memory devices, and more particularly to circuits that access and sense data values from memory cells within memory devices.

BACKGROUND

High speed memory devices can play an important role in high speed applications, including but not limited to circuits for communication systems and networks. Conventionally, static random access memories (SRAM) fulfill high speed access roles. SRAMs can store data in a static fashion (i.e., do not have to be refreshed), typically with a latching structure.

A conventional SRAM sensing operation typically includes: discharging one bit line of a bit line pair (to thereby generate a small differential signal across a bit line pair); amplifying the small signal with sense amplifier circuits; and equalizing the bit lines and sense amplifier circuits for a next sensing operation.

At very high speeds of operation (e.g., 3 GHz clock speed or faster), it can be very difficult to accomplish the above sensing operation tasks within a single clock period.

Various conventional approaches to improving sensing operation speeds are known. The speed at which a bit line can discharge can be limited by a capacitance of the bit line. Reducing the number of memory cells per bit line can reduce bit line capacitance, but at an undesirable increase in device size. The speed at which a bit line can discharge can also be limited by a memory cell current (i.e., current drawn by memory cell when connected to the bit line). However, even the smallest increases in memory cell can greatly impact a device (as there can be millions of such cells in the memory device). Reducing the number of memory cells per bit line can reduce bit line capacitance, but at an undesirable increase in device size.

A sensing speed for a sense amplifier can be increased by reducing a mismatch at differential inputs of a sense amplifier (SA). However, reductions in mismatch can require increased circuit area, again undesirably increasing device size. Further, increasing SA input area can also increase capacitance, working against sensing speed.

FIGS. 11A and 11B show one conventional approach to sensing operations in a memory device. FIG. 11A shows a conventional memory device 1100 having a bit lines 1111, a column MUX 1103, first switch circuits 1105, a pre-amplifier (or first SA) 1107, second switch circuits 1113, and a SA 1109.

FIG. 11B is a timing diagram showing a conventional sense operation for memory device 1100. FIG. 11B shows a number of waveforms: CLK shows a clock signal that can control operations of the conventional memory device; BL/BLB shows responses of bit line pairs; PA_OUT shows outputs of pre-amplifier 1107; and SA_OUT shows outputs of SA 1109.

At about time t0, a memory cell can be connected to a bit line pair. One bit line can discharge through the memory cell, resulting in the bit lines "splitting" (developing a very small differential voltage). After time t0, first switch circuits 1105 can connect the bit line pair to pre-amplifier 1107.

At about time t1, pre-amplifier 1107 can be activated providing a fast, but small amplification of the differential signal PA_OUT. Also, about this time, the memory cell can be disconnected from the bit line pair, and the bit line pair can be equalized.

At about time t2, second switch circuits 1113 can connect sense amplifier 1109 to an output of pre-amplifier 1107, and sense amplifier 1109 can be activated, amplifying the small signal to generate a larger output signal SA_OUT.

The conventional memory device 1100 can provide needed access speeds. However, the use of two sensing circuits (1107 and 1109) can adversely contribute to increased device size.

BRIEF DESCRIPTION OF THE DRAWINGS

FIG. 3 is a timing diagram showing a memory device operation according to another embodiment.

FIG. 4 is a timing diagram showing a memory device operation according to a further embodiment.

FIGS. 5 to 7 are block schematic diagrams of sense amplifier circuits that can be included in embodiments.

DETAILED DESCRIPTION

Figure 1:
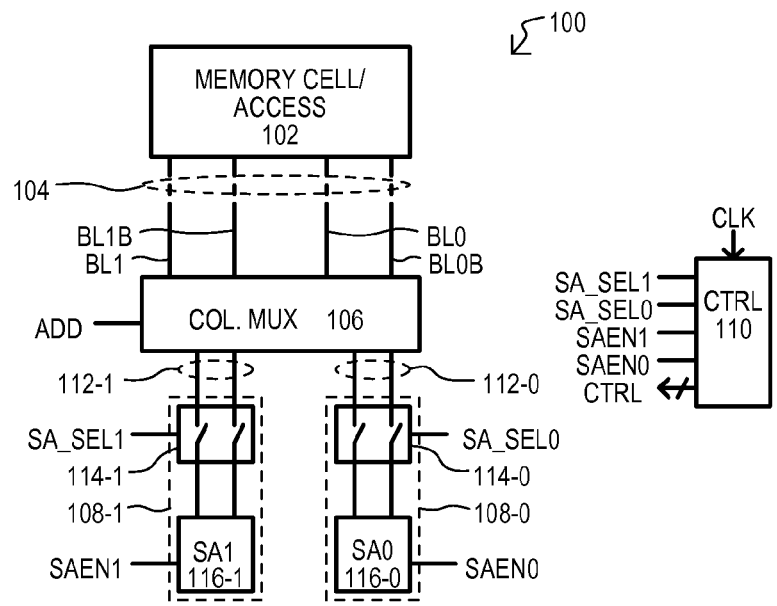
FIG. 1 is a block schematic diagram of a memory device according to one embodiment.

Various embodiments will now be described that include memory devices, circuits, and methods that can enable high speed data accesses by incorporating time-interleaved sensing circuits. In the various embodiments shown, like sections are referred to by the same reference character but with the leading digit(s) corresponding to the figure number.

Referring now to FIG. 1, a memory device according to one embodiment is shown in a block schematic diagram and designated by the general reference character 100. A memory device 100 can include memory cell and access circuits 102, bit lines 104, a column multiplexer 106, sense amplifier sections 108-0/1, and a control circuit 110.

Memory cell and access circuits 102 can connect memory cells to bit lines 104 to generate signals on the bit lines. In particular embodiments, memory cell access circuits can include access devices (e.g., transistors) within such memory cells that are enabled to connect the memory cells to bit lines 104. In some embodiments, memory cells can have differential connections to bit lines. That is, each memory cell can be connected to a bit line pair (e.g., BL1/BL1B, BL0/BLB) in a read operation. However, in other embodiments, memory cells can have single-ended connections to bit lines. That is, each memory cell can be connected to one bit line in a read operation. It is understood that while two bit line pairs are shown (BL0/BL0B, BL1/BL1B), many such bit line pairs can be a part of memory cell and access circuits 102.

In one particular embodiment, memory cell and access circuits 102 can include static random access memory (SRAM) cells having complementary data storage nodes between cross-coupled transistors. The complementary data nodes can be connected to bit line pairs by driving word lines.

In some embodiments, memory cell and access circuits 102 can also include bit line equalization circuits, for "equalizing" the bit lines. It is understood that such equalization can include coupling bit line pairs to one another and/or connecting bit lines to an equalization voltage.

A column multiplexer (MUX) circuit 106 can selectively connect bit lines 104 to column MUX outputs 112-0/1 in response to address data ADD. In the embodiment shown, based on received address data (ADD), column MUX circuit 106 can connect one bit line pair to one column MUX output 112-0 and another bit line pair to the other column MUX output 112-1.

Sense amplifier sections 108-0/1 can each include interleave switches 114-0/1 and a sense amplifier (SA) 116-0/1. Interleave switches 114-0/1 can connect bit line lines (via column MUX circuit 106) to their respective sense amplifiers in response to select signals SA_SEL0/1. As will be described in more detail below, interleave switches 114-0/1 can connect bit lines to SAs 116-0/1 in a time interleaved fashion. That is, while one interleave switch (e.g., 114-0) connects one bit line (or bit line pair, e.g., BL0/BL0B) to one sense amplifier (e.g., 116-0), the other interleave switch (e.g., 114-1) can isolate its sense amplifier (e.g., 116-1) from the bit lines. Subsequently, interleave switch (e.g., 114-1) can connect another bit line (or bit line pair, e.g., BL1/BL1B) to its sense amplifier (e.g., 116-1), while the other interleave switch (e.g., 114-0) isolates its sense amplifier (e.g., 116-0) from the bit lines.

SAs 116-0/1 can amplify bit line signals to generate output values. In the embodiment shown, SAs 116-0/1 can be activated by corresponding sense amplifier enable signals SAEN0 and SAEN1. As in the case of interleave switches 114-0/1, while one sense amplifier (e.g., 116-0) is amplifying a signal, the other sense amplifier (e.g., 116-1) can be acquiring a signal. Subsequently, sense amplifier (e.g., 116-1) can be activated to amplify its acquired signal, while the other sense amplifier (e.g., 116-0) acquires a new signal.

In some embodiments, SAs 116-0/1 can also include SA equalization circuits. SA equalization circuits can drive inputs to SAs to an equalization voltage. In some embodiments, outputs nodes of SAs 116-0/1 can also be the input nodes of the SA. Thus, a sense amplifier equalization operation can drive an output of the SA to an equalization voltage.

A control circuit 110 can generate timing and control signals described above. In the particular embodiment shown, a control circuit 110 can generate signals according to a timing clock CLK, and can output additional control signals CTRL for controlling other operations of a memory device 100.

Figure 2:
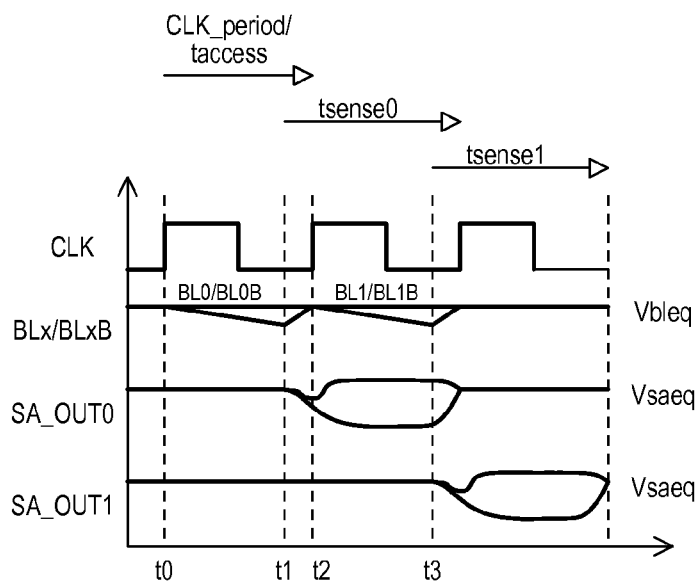
FIG. 2 is a timing diagram showing a memory device operation according to an embodiment.

FIG. 2 is a timing diagram showing a sense operation according to an embodiment. In one very particular embodiment, the operation of FIG. 2 can be executed by the memory device shown in FIG. 1. FIG. 2 shows a number of waveforms: CLK shows clock signal that can control timing operations of a memory device; BLx/BLxB shows responses of bit line pairs; SA_OUT0 shows outputs of one sense amplifier (SA); and SA_OUT1 shows outputs of another SA. In the very particular embodiment shown, the outputs of the SAs are also the inputs of the SA.

At about time t0, a memory cell can be connected to a bit line to generate a signal to be sensed (e.g., amplified). In the very particular embodiment shown, a memory cell can be connected to a bit line pair (BL0/BL0B). According to a data value stored by the memory cell, one bit line can remain at substantially at a bit line precharge voltage Vbleq, while the other bit line can begin to drop in voltage (i.e., the bit lines can start to "split"). It is understood that while FIG. 2 shows a memory device architecture where one bit line maintains a precharge voltage and the other falls (i.e., discharges), other embodiments can include one bit line maintaining a precharge voltage while the other rises in potential (i.e., charges).

At about time t1, the bit lines connected to a memory cell (BL0/BL0B) can be connected to an SA (the SA corresponding to SA_OUT0). In the very particular embodiment of FIG. 1, this can include a conductive path being created between the bit lines (BL0/BL0B) and sense amplifier (SA0 116-0) by operation of interleave switches 114-0 and column MUX circuit 106. It is noted that while FIG. 2 shows bit lines being connected to a sense amplifier at time t1, in other embodiments, such a connection can be made prior to, or after time t1.

It is understood that starting at time t1, inputs to a sense amplifier can also start to "split".

In particular embodiment shown, also at time t1, the bit line pair (BL0/BL0B) can be disconnected from the sense amplifier and equalized, driving both bit lines toward Vbleq. Also at this time (or prior to), the memory cell can be disconnected from the bit lines.

Some time after time t1 (i.e., after the bit lines have been disconnected from the sense amplifier), the SA previously connected to BL0/BL0B can be activated, amplifying any differential voltage developed at its inputs. In one very particular embodiment, such amplification can result in sense amplifier output (and input) nodes being driven to different power supply voltages. In the very particular embodiment of FIG. 1, this can include signal SAEN0 activating SA0 116-0. The very particular embodiment of FIG. 2 shows SA_OUT0 being activated at time t2.

At time t2, another memory cell can be connected to a bit line to generate a signal to be sensed (e.g., amplified). In the very particular embodiment shown, a memory cell can be connected to bit line pair (BL1/BL1B), and such bit lines can start to split. It is noted that BL1/BL1B can be the same pair as BL0/BL0B. Thus, in the embodiment shown, a bit line pair can be connected to one of multiple sense amplifiers each cycle, in a time multiplexed fashion. At the same time, sense amplifier operations can occur over more than one cycle.

Some time after t2, the sense amplifier corresponding to SA_OUT0 can equalize its input (and output) nodes, driving them back toward Vsaeq. It is understood that while a sense amplifier equalization operation is shown at time t3, such an operation can occur later or earlier in time.

At about time t3, bit lines BL1/BL1B can be connected to an SA (the SA corresponding to SA_OUT1). In the very particular embodiment of FIG. 1, operations can occur as described for time t2, but with SA0 116-1 and interleave switches 114-1.

Also at about time t3, bit line pair BL1/BL1B can be equalized.

It is noted that while FIG. 2 shows a clock signal CLK having a certain phase relationship with various other signals (i.e., rising edge of CLK is lined up with the start of bit lines BL0/BL0B splitting). Other embodiments can include different phase difference between signal CLK and the various other signals.

Referring still to FIG. 2, it is noted that bit lines (BL0/BL0B, BL1/BL1/B) can be connected to memory cells (to develop a split) and subsequently equalized within an access time (taccess), which can be the same as a period of clock signal CLK. At the same time, sense amplifier operations (tsense0) can occur over a time period greater than taccess. More particularly, the developing of a differential signal at a sense amplifier input, the amplification of the signal, and the subsequent sense amplifier equalization can occur over more than one clock cycle of CLK. However, due to time interleaved operations of the sense amplifiers, a sense amplifier output can be generated each cycle of CLK.

As also shown in FIG. 2, sense amplifier operations can overlap one another in time (i.e., tsense0 overlaps tsense1).

FIG. 3 is a timing diagram that includes waveforms like those of FIG. 2. FIG. 3 differs from FIG. 2 in that bit line pairs (BLx/BLxB) and sense amplifiers can be equalized to intermediate equalization voltages Vbleq and Vsaeq, respectively.

FIG. 4 is a timing diagram that includes waveforms like those of FIG. 2. FIG. 4 differs from FIG. 2 in that the operation can be directed to a memory architecture having memory cells connected to bit lines in a single-ended configuration, rather than a differential configuration (i.e., memory cells are connected to single bit lines and not bit line pairs). Consequently, operations can differ from FIG. 2 as follows.

At about time t0, a memory cell can be connected to one bit line to generate a signal to be sensed. According to a data value stored by the memory cell, the bit line can fall (i.e., discharge) or rise (i.e., charge).

At about time t1, the bit line BL0 can be connected to one input of an SA (the SA corresponding to SA_OUT0). The other input of the SA can be connected to a reference voltage (which can be Vsaeq, in some embodiments). In the particular embodiment shown, also at time t1, the bit line BL0 can be equalized (driven to Vbleq).

At about time t2, another memory cell can be connected to a bit line BL1 (or BL0).

Figure 11A:
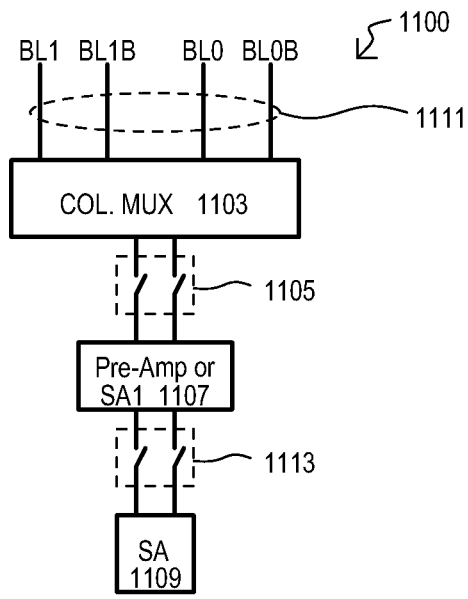
FIGS. 11A and 11B are diagrams showing a conventional memory device.
Figure 11B:
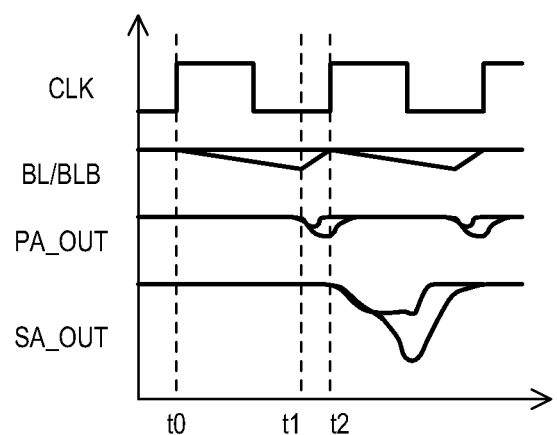

From the embodiments above, is it understood that use of time interleaved sensing can enable relatively large signal development times at the inputs of sense amplifiers. More particularly, referring to FIG. 2, a sense amplifier can be connected to a bit line (or bit line pair) at any point starting at time t0 or later. Such an arrangement can result in the development of stronger and/or more stable signals at the inputs of sense amplifiers before they are activated, as compared to embodiments that execute sensing operations (i.e., signal development at SA input, SA activation, SA equalization) in one clock cycle. Consequently, embodiments can employ simpler sense amplifier designs, for a more compact device. This is in contrast to conventional approaches, like that shown in FIGS. 11A and 11B.

Examples of sense amplifiers circuits that can be included in embodiments will now be described.

FIG. 5 is a schematic diagram of a sense amplifier (SA 516) formed with six active devices 518-0 to -5. Active devices (518-0 to -5) can include any suitable device, such as a transistor, that provides a signal gain between two terminals in response to a signal at a control terminal. SA 516 can have sense nodes 520-0/1 that can serve as both input and output nodes. Active devices 518-1/2 can be cross-coupled between a first supply node 522-0 and sense nodes 520-0/1. Similarly, active devices 518-3/4 can be cross-coupled between a sense nodes 520-0/1 and second supply node 522-1. First activation device 518-0 can connect first supply node 522-0 to a first power supply voltage Vpwr1 in response to a signal SAEN0. Second activation device 518-1 can connect second supply node 522-1 to a second power supply voltage Vpwr0 in response to a signal SAEN1.

In operation, signals SAEN0/1 can be activated, and sense amplifier SA 516 can drive one of sense nodes to one power supply voltage (e.g., Vpwr1), and the other sense node to the other power supply voltage (e.g., Vpwr0), based on a differential voltage between the sense nodes 520-0/1 (formed during a signal development time, as noted above).

FIG. 6 is a schematic diagram of a sense amplifier (SA 616) formed with five active devices 618-1 to -5. FIG. 6 differs from FIG. 5 in that it includes only one activation device 618-5, activated by a signal SAEN. Further, first supply node 622-0 can be the first power supply node Vpwr1.

FIG. 7 is a schematic diagram of a sense amplifier (SA 716) formed with complementary metal oxide semiconductor (CMOS) type devices. N-channel MOS type devices are shown as N70 to N72, and p-channel type MOS devices are shown as P70/P71. In one very particular embodiment, SA 716 can be one very particular implementation of that shown in FIG. 6.

It is understood that while particular sense amplifiers are shown in FIGS. 5-7, other embodiments can include different sense amplifier types, including but not limited to those having a current sensing operation, or a combination of current and voltage sensing.

While embodiments shown herein can allow for compact sense amplifier designs, and hence reductions the area needed for sense amplifiers, other embodiments can provide for reduced sense amplifier area by multiplexing sense amplifiers. One such embodiment is shown in FIG. 8.

Figure 8:
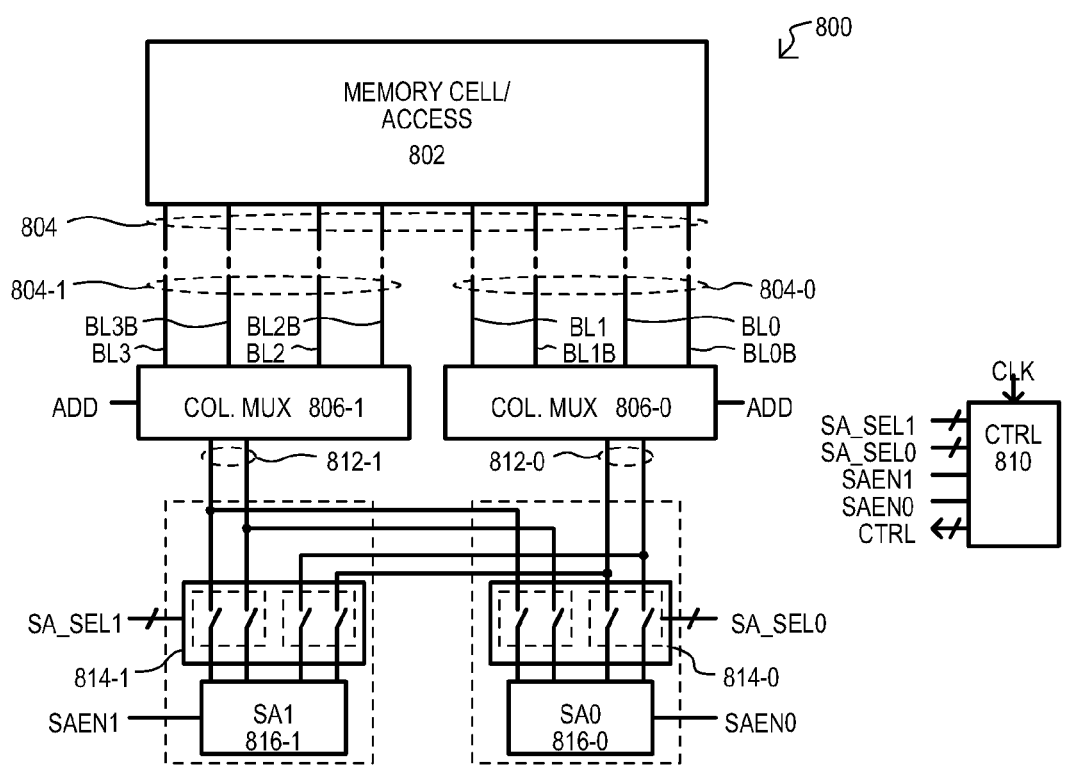
FIG. 8 is a block schematic diagram of a memory device having multiplexed sense amplifiers according to an embodiment.

FIG. 8 is a block schematic diagram of a memory device 800 according to another embodiment. Memory device 800 can include sections like those of FIG. 1, and such like sections can operate as described in FIG. 1, or in an equivalent manner.

The embodiment of FIG. 8 differs from that of FIG. 1 in that bit lines 804 can include different bit line groups 804-0/1. Each different bit line group (804-0/1) can be connected to a different column MUX circuit 806-0/1. Each column MUX circuit 806-01/can connect a bit line (or bit line pair) to a corresponding column MUX output 812-0/1.

The embodiment of FIG. 8 also differs from that of FIG. 1 in that interleave switches 814-0/1 can connect either of column MUX outputs 812-0/1 to the corresponding sense amplifier 816-0/1.

In operation, during a first clock cycle period, one interleave switch (e.g., 814-0) can connect one column MUX output (e.g., 812-0) to its corresponding sense amplifier 816-0. Over two or more clock cycle periods, sense amplifier 816-0 can develop a differential across its inputs, amplify the differential and then equalize its inputs. During a second clock cycle period (that follows the first clock cycle period, and overlaps with the activation of sense amplifier 816-0), the other interleave switch (e.g., 814-1) can connect the other column MUX output (e.g., 812-1) to its sense amplifier 816-1. Over two or more clock cycle periods, sense amplifier 816-1 can develop a differential across its inputs, amplify the differential and then equalize its inputs.

In other operations, the order of operations can also be reversed. For example, interleave switch 814-0 can connect to column MUX output 812-1, followed by interleave switch 814-1 connecting to column MUX output 812-0.

In other operations, access to sense amplifiers 816-0/1 can be reversed. For example, in one clock period, interleave switch 814-1 can connect column MUX output 812-0, while in a preceding or subsequent clock period, interleave switch 814-0 can connect column MUX output 812-1.

Figure 9A:
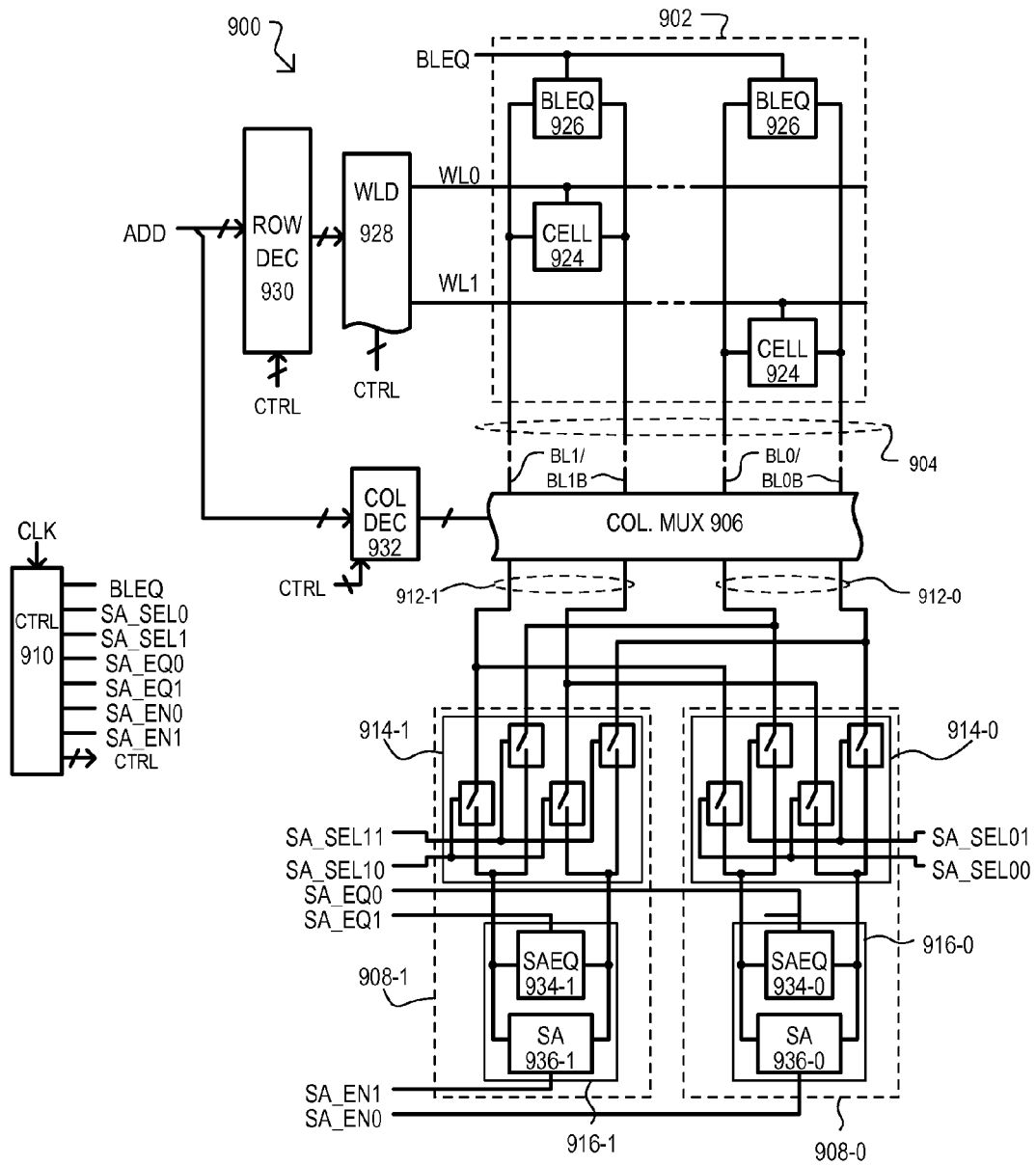
FIG. 9A is a block schematic diagram of a memory device according to another embodiment.

FIG. 9A is a block schematic diagram of a memory device 900 according to another embodiment. Memory device 900 can include sections like those of FIG. 1, and such like sections can operate as described in FIG. 1, or in an equivalent manner.

The embodiment of FIG. 9A differs from that of FIG. 1 in that memory cell and access circuits 902 are shown to include memory cells 924 and bit line equalization circuits 926. Each memory cell 924 can be connected to a bit line pair (BL1/BL1B, BL0/BL0B) and a word line (two shown as WL0/1). By operation of a word lines (WL0/1), memory cells 924 can be connected to a bit line pair to develop a differential voltage according to a stored data value. Bit line equalization circuits 926 can equalize bit line pairs (BL1/BL1B, BL0/BL0B) in response to a signal BLEQ as described herein, or equivalents.

The embodiment of FIG. 9A also differs from that of FIG. 1 in that sense amplifiers 916-0/1 are shown to include a sense amplifier equalization circuit 934-0/1 and an amplifier section 936-0/1. Sense amplifier equalization circuits 934-0/1 can equalize inputs to each amplifier section (936-0/1) (which also serve as sense amplifier outputs) in response to SA equalization signal SA_EQ0/1. Amplifier sections 936-0/1 can amplify a voltage at SA inputs. In very particular embodiments, amplifier sections 936-0/1 can include any of SA circuits shown in FIGS. 5-7. Further memory device 900 can include interleave switches 914-0/1 like those shown in FIG. 8.

FIG. 9A also shows a row decoder 930, word line driver 928 and column decoder 932. In the embodiment shown, in response to address data (ADD), row decoder 930 can decode a portion of ADD to provide row selection signals to word line driver 928. In response to such row selection signals, word line driver 928 can activate a word line (e.g., WL0/1) to thereby connect a memory cell to a bit line pair. Column decoder 932 can decode a portion of ADD to provide column selection signals to column MUX circuit 906. In response to such column selection signals, column MUX circuit 906 can connect bit line pairs to column MUX outputs 912-0/1. In the embodiment shown, row decoder 930, word line driver 928 and column decoder 932 can operate in response to control signals (CTRL) generated by control circuit 910 in response to clock signal CLK.

Figure 9B:
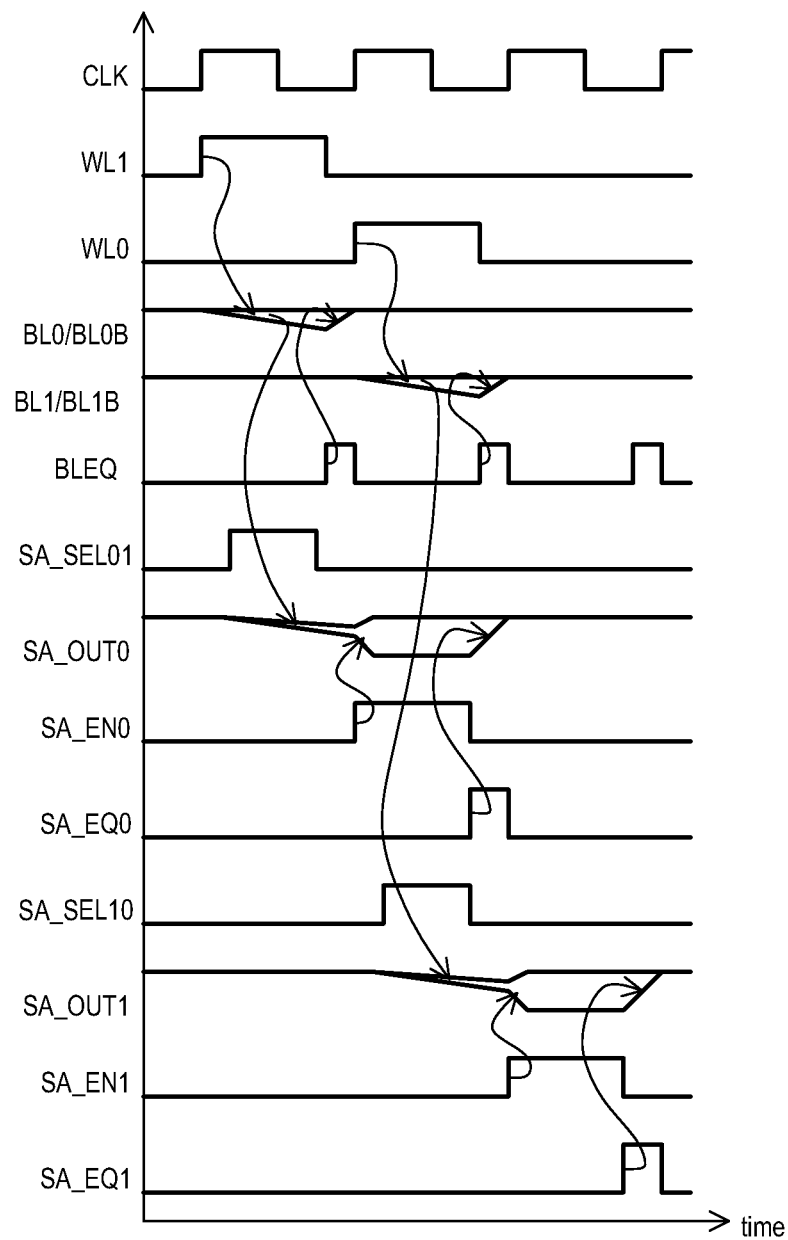
FIG. 9B is a timing diagram showing operations for a memory device like that of FIG. 9A.

FIG. 9B is a timing diagram showing particular operations for the embodiment of FIG. 9A.

Referring to FIG. 9B, word line WL1 can be activated (driven high), resulting in a memory cell being connected to a bit line pair (BL0/BL0B). Consequently, bit lines BL0/BL0B can start to split.

Subsequently, signal SA_SEL01 can be activated (driven high), connecting sense amplifier 916-0 to bit line pair BL0/BL0B. As a result, inputs of the sense amplifier (shown as SA_OUT0) can begin to split. Word line WL1 can be deactivated (return low), disconnecting the memory cell from bit line pair BL0/BL0B.

Signal SA_EN0 can be activated, and amplifier section 936-0 can amplify the differential voltage at the input of sense amplifier section 916-0, resulting a large output signal SA_OUT0.

Subsequently, signal SA_EQ0 can be activated (driven high), and inputs (outputs) of sense amplifier section 934-0 can be equalized.

It is noted that while sense amplifier section 916-0 is amplifying, word line WL0 can be activated, and the same sense operation can occur, but with sense amplifier section 908-1. Such an operation can connect a memory cell to the same bit line or a different bit line as the previous operation. That is, while FIG. 9B shows bit line pair BL1/BL1B splitting after bit line pair BL0/BL0B, the same bit line pair (BL0/BL0B) could split in consecutive operations.

As noted for FIG. 2, the particular phase relationship of signal CLK to the various other signals of FIG. 9B is provided by way of example only.

Figure 10:
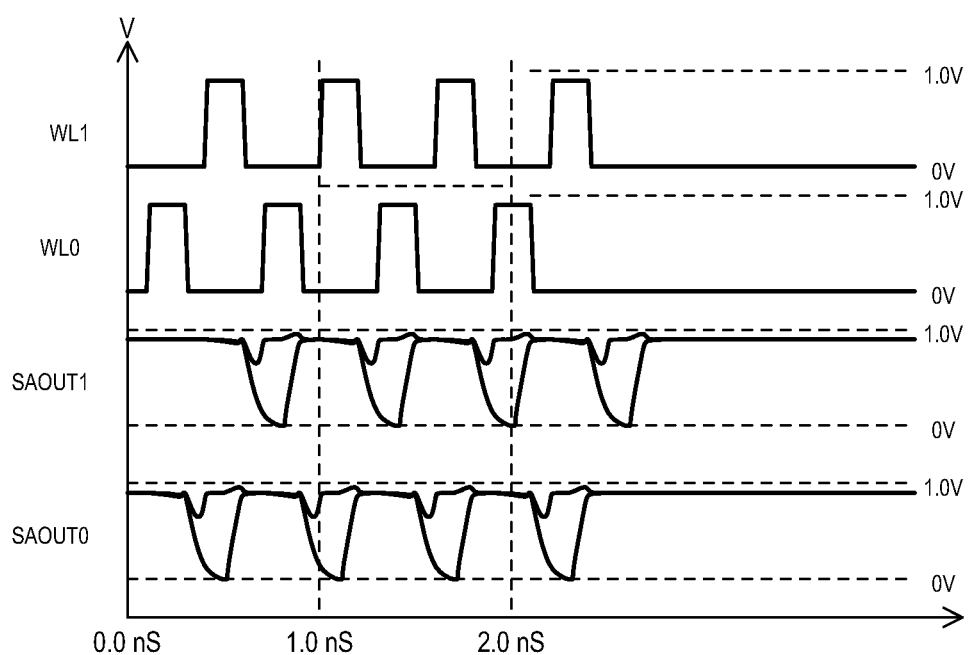
FIG. 10 is a timing diagram showing simulation results for a memory device according to one very particular embodiment.

FIG. 10 represents simulation results for one very particular implementation of an embodiment. FIG. 10 shows simulation results for an architecture like that shown in FIG. 8 that incorporates sense amplifiers like those shown in FIG. 7. The design assumed a bit line capacitance of 30 femtoFarads (fF) for 256 cells per bit line, along with a data line capacitance of 10 fF. FIG. 10 shows a read operation for an SRAM device operating at 3.2 GHz.

In FIG. 10, waveform WL1 shows the operation of a first word line. Waveform WL0 shows the operation of another word line. Waveform SAOUT1 shows a response for a sense amplifier connected to a memory cell accessed by word line WL1. Waveform SAOUT0 shows a response for a sense amplifier connected to a memory cell accessed by word line WL0.

As noted above, while some embodiments show differential memory cell connections, alternate embodiments can include single ended connections. As but one very particular example, an embodiment like that of FIG. 9A, could have memory cells connected to but one bit line. In a sense operation, one bit line can provide a data value via an accessed memory cell, while the other bit line functions as a "dummy" bit line, being isolated from the memory cells. Further, in a single ended case, a memory device can have an "open bit line" architecture as opposed to a closed bit line architecture. In an open bit line architecture, a dummy bit line can be from an array section on one side of the sense amplifier, while the accessed memory cell can be from an array on an opposite side of the sense amplifier.

It should be appreciated that in the foregoing description of exemplary embodiments, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

It is also understood that the embodiments of the invention may be practiced in the absence of an element and/or step not specifically disclosed. That is, an inventive feature of the invention may be elimination of an element.

Accordingly, while the various aspects of the particular embodiments set forth herein have been described in detail, the present invention could be subject to various changes, substitutions, and alterations without departing from the spirit and scope of the invention.

What is claimed is:

1. A memory device, comprising:
   first sense amplifiers coupled to bit lines of a memory array in a first access period and de-coupled from the bit lines in a first sense period, the first sense amplifiers configured to amplify data signals from the memory array in the first sense period; and
   second sense amplifiers coupled to the bit lines in a second access period that follows the first access period and configured to amplify data signals from the memory cell array in a second sense period that overlaps the first sense period.

2. The memory device of claim 1, wherein:
each sense amplifier comprises
an amplifier circuit, and
sense amplifier switch circuits coupled between the amplifier and the corresponding bit lines configured to selectively couple the sense amplifier to at least one bit line.

3. The memory device of claim 1, wherein:
each first and second sense amplifier is configured to access a bit line pair of the memory cell array, and amplify a differential voltage across the bit line pair.

4. The memory device of claim 1, further including:
a column multiplexer (MUX) circuit coupled between the first and second sense amplifiers, the column MUX circuit configured to selectively connect bit lines to first and second sense amplifiers in response to address data provided to the memory device.

5. The memory device of claim 1, further including:
a first and second column multiplexer (MUX) circuits configured to selectively connect bit lines to first and second column MUX outputs in response to address data provided to the memory device; and
each sense amplifier comprises an input MUX configured to selectively connect an amplifier to one of the column MUX outputs.

6. The memory device of claim 1, wherein:
the first and second access periods are less than the first sense period and second sense period.

7. The memory device of claim 6, wherein:
the access circuits include
first word lines that couple first memory cells to first bit lines,
second word lines that couple second memory cells to second bit lines, and
a word line driver configured to activate one first and one second word lines in sequential sense periods.

8. A memory device, comprising:
a plurality of sense amplifier sections configured to access bit lines of a same memory cell array in a time multiplexed fashion, each sense amplifier amplifying a signal from at least one bit line, and equalizing sense amplifier inputs over a sensing period; and
access circuits configured to sequentially couple memory cells to bit lines and equalize the bit lines in a bit line access period less than the sensing period.

9. The memory device of claim 8, further including:
a clock circuit configured to generate a periodic clock signal to control operations of the memory device;
the bit line access period is one clock period of the clock signal; and
the sensing period is more than one clock period of the clock signal.

10. The memory device of claim 8, wherein:
the sense amplifier sections include
first sense amplifier sections, and
second sense amplifier sections configured to access bit lines after the first sense amplifier sections, but within the sensing period of the first sense amplifier sections.

11. The memory device of claim 8, wherein:
each sense amplifier section comprises
a sense amplifier circuit configured to amplify a bit line signal at a sense amplifier input, and
sense amplifier equalization circuits configured to drive the sense amplifier input toward a predetermined level.

12. The memory device of claim 8, wherein:
the access circuits comprise
a plurality of word lines, each coupled to a row of memory cells,
at least one access device within each memory cell configured to couple the memory cell to a bit line in response to a signal on the corresponding word line, and
bit line equalization circuits coupled to the bit lines configured to drive the bit lines toward a bit line equalization voltage.

13. The memory device of claim 8, wherein:
the access circuits comprise column multiplexer (MUX) circuits, each coupled to a different group of bit lines, each column MUX coupling at least one bit line of its corresponding group to a column MUX output in response to address data; and
each sense amplifier section comprises
a sense amplifier, and
a sense amplifier MUX configured to selectively connect the sense amplifier to any one of the column MUX outputs.

14. A method, comprising:
sampling bit line signals of a memory cell array with multiple sense amplifiers in a time multiplexed fashion including
coupling memory cells to bit lines in sequential access periods to develop differential signals at sense amplifier inputs;
over a first sense period, while de-coupling bit lines from one set of sense amplifiers, amplifying bit line signals from a first access period with the one set of sense amplifiers; and
over a second sense period, while de-coupling bit lines from another set of sense amplifiers, amplifying bit line signals from a second access period, immediately following the first access period, with the other set of sense amplifiers over a second sense period that overlaps the first sense period.

15. The method of claim 14, wherein:
the access periods have a duration of one clock period of a timing signal; and
the first and second sense periods have a duration of more than one period of the timing signal.

16. The method of claim 14, further including:
equalizing the bit lines in each sequential access period.

17. The method of claim 14, further including:
equalizing inputs to the one set of sense amplifiers in the first sense period; and
equalizing inputs to the other set of sense amplifiers in the second sense periods.

18. The method of claim 14, wherein:
coupling memory cells to different bit lines in sequential access periods includes sequentially coupling at least two bit lines from a first group of bit lines to a first column multiplexer (MUX) output in first and second access periods in response to address data;
amplifying bit line signals from the first access period includes coupling a first sense amplifier to the first column MUX output in the first access period; and
amplifying bit line signals from the second access period includes coupling second sense amplifier to the second column MUX output in the second access period.

19. The method of claim 14, wherein:
coupling memory cells to different bit lines in sequential access periods includes
activating one of a plurality of first word lines coupled to first memory cells in a first access period, and activating one of a plurality of second word lines coupled to second memory cells in second access period that immediately follows the first access period.

20. The method of claim 14, wherein:
the same bit lines are accessible in sequential access periods.

* * * * *